United States Patent
Michallick et al.

(10) Patent No.: US 10,014,810 B1
(45) Date of Patent: Jul. 3, 2018

(54) REDUCED-IMPEDANCE ACTIVE CURRENT MEASUREMENT

(71) Applicant: Texas Instruments Incorporated, Dallas, TX (US)

(72) Inventors: Ronald Andrew Michallick, McKinney, TX (US); David Anthony White, McKinney, TX (US); Michael Nolan Jervis, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/449,820

(22) Filed: Mar. 3, 2017

(51) Int. Cl.
| | |
|---|---|
| G05F 1/00 | (2006.01) |
| H02P 23/14 | (2006.01) |
| H03F 3/45 | (2006.01) |
| G01R 31/34 | (2006.01) |
| G01R 19/00 | (2006.01) |

(52) U.S. Cl.
CPC .......... *H02P 23/14* (2013.01); *G01R 19/0092* (2013.01); *G01R 31/343* (2013.01); *H03F 3/45475* (2013.01); *H03F 2203/45116* (2013.01)

(58) Field of Classification Search
CPC ..... G01R 31/06; G01R 15/183; H01F 27/427; H01F 38/32; H01F 27/42; H01F 27/425; G05F 1/00; G05F 1/04; G05F 1/08

USPC ........ 323/356, 357, 358, 280; 324/127, 128, 324/547, 153; 361/42; 336/173; 318/400.21, 400.22, 400.01, 700, 701, 318/727, 678, 679, 680, 681
See application file for complete search history.

(56) References Cited

U.S. PATENT DOCUMENTS

| | | | |
|---|---|---|---|
| 6,522,517 B1 * | 2/2003 | Edel | G01R 15/185 361/143 |
| 7,525,297 B2 * | 4/2009 | Gibellini | H01F 27/427 323/356 |

* cited by examiner

*Primary Examiner* — Antony M Paul
(74) *Attorney, Agent, or Firm* — Lawrence J. Bassuk; Charles A. Brill; Frank D. Cimino (57) ABSTRACT

A reduced-impedance active measurement device, for example, includes a current transformer for generating a sense current for monitoring a drive signal. An amplifier is arranged to generate an offsetting current in response to the sense current, wherein the offsetting current is opposite in polarity to the sense current. A sense resistor is arranged to develop a sensed voltage signal across the sense resistor in response to the received sense current and the offsetting current. Optionally, the drive signal can be used to drive and control a motor.

15 Claims, 4 Drawing Sheets

REDUCED-IMPEDANCE ACTIVE CURRENT MEASUREMENT

BACKGROUND

Integrated circuits are used in a variety of applications including applications in which a coil (such as a motor coil) is electronically controlled. To control the operation of a coil, the current flowing through the coil in response to a coil stimulus is measured. The measurement of the current is processed by a controller, which adjusts the coil stimulus such that the operation of the coil is altered (e.g., controlled) in response to the measurement. However, the measurement of the current through the coil often requires developing a voltage in response to the current (e.g., by coupling a resistance in series with or by inductively coupling to the current to be measured). Coupling to the current to be measured affects the amount of current flowing through the coil, which interferes with the amount of current being measured. Accordingly the current measurement is not a pure measurement of the coil current otherwise flowing through the coil, which can reduce the accuracy of the controller for controlling the coil current.

SUMMARY

The problems noted above can be addressed in a testing circuit/system and method for monitoring currents. A reduced-impedance active measurement device, for example, includes a current transformer for generating a sense current for inductively monitoring a drive signal. An amplifier is arranged to generate an offsetting current in response to the sense current, wherein the offsetting current is opposite in polarity to the sense current. A sense resistor is arranged to develop a sensed voltage signal across the sense resistor in response to the received sense current and the offsetting current. The sensed voltage signal can be used to generate (and/or control) the drive signal being monitored. Optionally, the drive signal can be used to drive and control a motor.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion.

Figure 1:
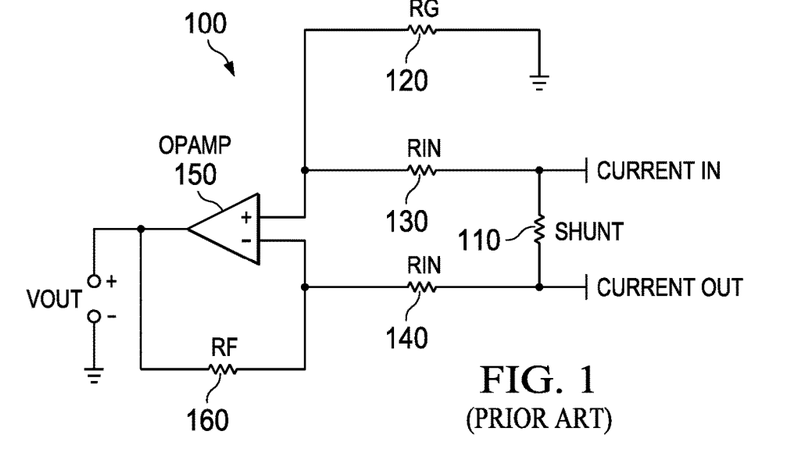
FIG. 1 shows an illustrative circuit 100 in accordance for measuring current.

FIG. 1 shows an illustrative circuit 100 in accordance for measuring current. The circuit 100 includes a substrate upon which a shunt resistor (SHUNT) 110, a ground resistor (RG) 120, a first input resistor (RIN) 130, a second input resistor 140, an operational amplifier (OPAMP) 150, and the feedback resistor (RF) 160 are formed.

The circuit 100 is coupled to receive a current to be measured. The current to be measured is applied to a first terminal of the shunt resistor 110 and a first terminal of the input resistor 130. The second terminal of the shunt resistor 110 is coupled to a first terminal of the input resistor 140. In response to the applied current, a voltage is developed across the first terminal and a second terminal of the shunt resistor 110. Accordingly, a first node of the developed voltage is coupled to a positive input terminal of the operational amplifier 150, and a second node of the voltage to the measured as coupled to a negative input terminal of the operational amplifier 150.

The ground resistor 120 is coupled in series between ground and the positive input terminal of the operational amplifier 150 such that a voltage divider is formed by the ground resistor 120 and the first input resistor 130. Accordingly, a threshold voltage for controlling the operational amplifier can be set in accordance with the values selected for the ground resistor 120 and the first input resistor 130.

The feedback resistor 160 is coupled in series between the output terminal of the operational amplifier 150 and the negative input terminal of the operational amplifier 150. The gain of the operational amplifier 150 can be set in accordance with the values selected for the second input of resistor 140 and the feedback resistor 160.

The operational amplifier 150 generates an output voltage in response to the voltage developed across the shunt resistor 110 (which is developed in response to the CURRENT IN and the CURRENT OUT). As discussed above, the shunt resistor 110 affects (e.g., disturbs) the amount of current be measured. Lowering the value of the shunt resistor 110, lowers the effect (e.g., disturbance) of the shunt resistor 110 upon the measurement being made. Ideally, the value of the shunt resistor 110 would be zero ohms; in the ideal case however, no shunt voltage would be developed, and accordingly no current measurement could be made as a voltage measurement.

Lowering the value of the shunt resistor 110, reduces the levels of the shunt voltage such that obtaining accurate measurements in response to the lowered shunt voltages would entail higher accuracy (e.g., and higher cost) amplifiers for developing higher voltage gains. Further, the voltage offsets of the first and second input terminals of the operational amplifier 150 limit the minimum voltage of the lowered shunt voltages when making accurate voltage measurements. In contrast, raising the value of the shunt resistor 110 causes a greater current loss of the current to be measured, which affects the amount of current to be measured.

The value of the shunt resistor 110 is a minimum input impedance of the circuit 100. The value of the shunt resistor 110 selected for making accurate current measurements is substantially higher than a circuit for performing ideal current measurements, which has a zero impedance.

Figure 2:
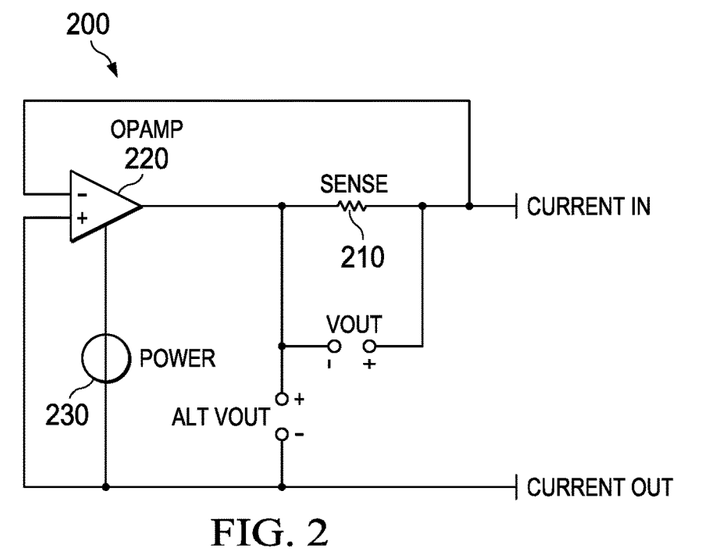
FIG. 2 is a schematic diagram of a reduced input-impedance active current-measurement circuit in accordance with embodiments on the present disclosure.

FIG. 2 is a schematic diagram of a reduced input-impedance active current-measurement circuit in accordance with embodiments on the present disclosure. For example, the circuit 200 is, or is incorporated into, an electronic system, such as a computer, electronics control "box" or module, robotics equipment (including fixed or mobile), automobiles, air conditioner, motor, solenoid, or any other type of system or device in which a current is measured and the current measurement is used to control the device from which the current is measured.

In some embodiments, the circuit 200 includes a substrate upon which a sense resistor (SENSE) 210 and an operational amplifier (OPAMP) 220 are formed. Generally, the circuit 200 generates an offsetting (e.g., opposite) current for offsetting an input current to be measured. Offsetting the input current can lower the input impedance of the circuit 200 to near-zero values.

The circuit 200 is coupled to receive a current to the measured. The current to be measured (CURRENT IN) is applied to a first terminal of the sense resistor 210 and a negative input terminal of the operational amplifier 220. The positive input terminal of the operational amplifier 220 is coupled to ground. The output terminal of the operational amplifier 220 is coupled to a second terminal of the sense resistor 210. The ground of the circuit 200 is coupled as the CURRENT OUT node.

In operation, a current measurement voltage is developed across the sense resistor 210 in response to the CURRENT IN and the CURRENT OUT. The current measurement voltage is indicative (e.g., proportional) to the amount of current flowing from the CURRENT IN node to the CURRENT OUT node (e.g., such that the CURRENT IN is received by the CURRENT IN node and a CURRENT OUT is returned to the CURRENT OUT node, where the CURRENT OUT is equal to the CURRENT IN). The generated offsetting current drives the voltage to (e.g., near-) zero volts such that the voltage developed across the sense resistor 210 is indicative of the current to be measured (e.g., CURRENT IN).

Because (for example) the input terminals of the operational amplifier 220 are high impedance terminals, the CURRENT IN is equal to the CURRENT OUT (which is the current to be measured). The outgoing current develops a voltage potential at the CURRENT OUT node such that the potential measured from the second node of the sense resistor 210 to the CURRENT OUT node is indicative of the current to be measured.

Accordingly, the current measurement voltage (VOUT) can be measured across (e.g., between) the first terminal of the sense resistor 210 (e.g., the CURRENT IN node) and the output terminal of the operational amplifier 220 (e.g., or the first terminal of the sense resistor 210). The current measurement voltage can be determined as the product of the resistance value (in ohms) of the sense resistor 210 and the value (in milliamps) of the input current. Optionally, the current measurement voltage (ALT VOUT) can be measured across the output terminal of the operational amplifier 220 and the ground of circuit 200 (e.g., the CURRENT OUT node).

The operational amplifier 220 receives power from a circuit 200 power rail and generates the offsetting current in response to the voltage developed across the sense resistor 210. The generated offsetting current is substantially equal and opposite to the input current to be measured such that the voltage between the CURRENT IN node and the CURRENT OUT node is lowered (e.g., to nearly zero volts).

The value of the sense resistor is selected to be sufficiently high such that the voltage offsets of the operational amplifier 220 do not substantially contribute to a voltage error measurement (e.g., where the voltage offsets contribute to errors in a measurement that exceed a tolerance for error of a design). Accordingly, the sense resistor can be comparatively large (e.g., as compared with the shunt resistor 110) because the gain of the operational amplifier 220 reduces the effective input impedance of the circuit 200 to substantially zero values (e.g., such that the current output by the operational amplifier 120 is equal to the current sourced by the CURRENT IN node and sunk by the CURRENT OUT node).

In operation, the operational amplifier 220 generates a sensed voltage in response to the voltage developed across the sense resistor 210 (which is developed in response to the CURRENT IN and the Current OUT). The sensed voltage is a signal for indicating (for example) the amount of current flowing from the CURRENT IN terminal to the CURRENT OUT terminal.

Accordingly, the output voltage is an indication of the CURRENT IN, which in turn is an indication of a current (such as a high-current motor drive current) to be measured. Because of the lowered input impedance of the circuit (e.g., as compared with the comparatively high burden resistance of circuit 100), the sense resistor 210 does not affect the amount of current be measured (e.g., when the input impedance of the circuit is zero ohms). Increasing the offsetting current (e.g., by increasing the gain of the operational amplifier 220) lowers the effective impedance of the circuit 200 upon the measurement being made. Ideally, the value of the offsetting current is exactly equal to the CURRENT IN; however, normal manufacturing tolerances can result in substantially small (e.g., less than one percent) amounts and variations, which (for example) do not noticeably affect the control of a given motor.

The output voltage generated by the operation amplifier 220 can be generated by coupling the generated offsetting current to an output (e.g., relative to the substrate) pin, wherein the output pin is coupled to an external resistor. Accordingly, a voltage indicative of the generated offsetting current is generated across the external resistor and can be measured by a voltage measurement device external to the substrate. The external resistor is selected to have a relatively high value compared to the sense resistor such that the external resistor does not sink a current large current to cause the measurement errors to exceed a design parameter for controlling a motor. Optionally, the voltage can be measured by circuitry (such as an analog-to-digital converter) formed on the substrate (e.g., such that the measurement of the output voltage is made by circuitry on the substrate).

Figure 3:
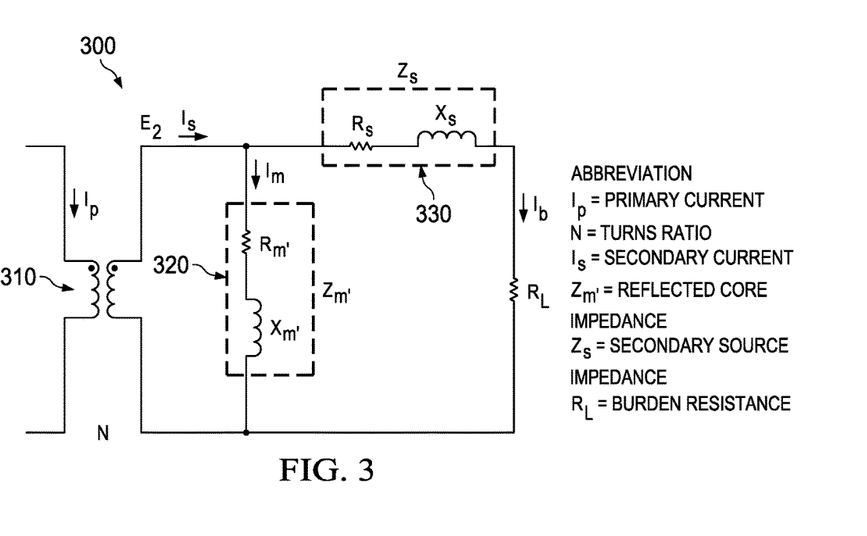
FIG. 3 is a schematic diagram of current-transformer circuit model showing burden resistance in accordance with some embodiments.

FIG. 3 is a schematic diagram of current-transformer circuit model showing burden resistance in accordance with some embodiments. In some applications, the current in a wire is measured inductively where a toroidal core surrounds the wire through which the current to be measured flows (such that the wire is effectively a primary of a transformer whereas a coil formed around the toroidal core forms a secondary of the transformer). The toroidal coil typically includes windings for inductively generating a secondary voltage in accordance with a turns ratio N and the voltage of the primary (as discussed below with reference to FIG. 6).

In some embodiments, the current-transformer 300 circuit includes a current transformer 310 and a burden resistance ($R_L$), which can be an impedance load of an active current measurement circuit. The current transformer 310 includes electrical characteristics, which include a reflected core impedance ($Z_{m'}$) 320 and a secondary source impedance ($Z_{s'}$) 330. The reflected core impedance 320 is in parallel with a magnetic impedance of the core of the current transformer 310 and is a reflection of the impedance of the primary of the current transformer 310 to the secondary of the current transformer 310. The reflected core impedance 320 includes distributed series resistance ($R_{m'}$) and distributed series inductance ($X_{m'}$) such that $Z_{m'}=(R_{m'}+X_{m'})$.

The secondary source impedance 330 is in series with the magnetic impedance of the core of the current transformer 310. The secondary source impedance 330 includes distributed series resistance ($R_{s'}$) and distributed series inductance ($X_{s'}$) such that $Z_{s'}=(R_{s'}+X_{s'})$.

As discussed above, the burden resistance (e.g., the impedance load of a measurement circuit) affects the measurement of the voltage generated by the current transformer. As the burden resistance increases, the accuracy of measurements made by circuitry introducing the burden resistance decreases. For example, the burden resistance $R_L$ is in parallel with the magnetic impedance of the core of the current transformer 310.

The secondary voltage $E_2$ can be expressed as the product of the secondary current $I_s$ and the combined effective (e.g., network) impedance of the reflected core impedance ($Z_{m'}$) 320, the secondary source impedance ($Z_{s'}$) 330, and the burden resistance ($R_L$) as follows:

$$E_2 = I_s \times \left( \frac{((Z_{m'} \times (x_s + R_L)))}{((Z_{m'} + (Z_s + R_L)))} \right) \quad \text{(Eq. 1)}$$

The secondary voltage $E_2$ can also be expressed as the product of the reflected core current current $I_m$ and the reflected core impedance ($Z_{m'}$) 320 as follows:

$$E_2 = I_m \times Z_{m'} \quad \text{(Eq. 2)}$$

The current $I_b$ flows through the burden resistance $R_L$ can be expressed as the difference of the secondary current $I_s$ and the reflected core current $I_m$ as follows:

$$I_b = I_s - I_m \quad \text{(Eq. 3)}$$

Accordingly, the burden resistance $R_L$ increases the voltage of the secondary as the burden resistance increases. In applications using shunt resistors (where the value of the shunt resistor is the burden resistance $R_L$), the value of the shunt resistor is selected to be sufficiently high so as to help overcome inaccuracies resulting from offset voltages of the input pins of the operational amplifier.

In contrast to the shunt resistor applications, discussed embodiments of the reduced input-impedance active current-measurement circuits force the effective burden resistance RL to be zero (or near zero), which substantially reduces (and/or eliminates) the voltage rise in the secondary current (e.g., such that the accuracy of the current measurement is increased). In some embodiments, the burden resistance RL is the value of the sense resistor divided by the operational amplifier gain such that: RL=RSENSE/GAINOP-AMP. Accordingly the gain of the operational amplifier is selected to minimize (and/or reduce) the value of RL. In an example system where the resistance of the sense resistor is 10 ohms and the gain of the operational amplifier is 100,000, the burden resistance RL in ohms is the reciprocal of 10,000 (e.g., less than 1 ohm).

Figure 4:
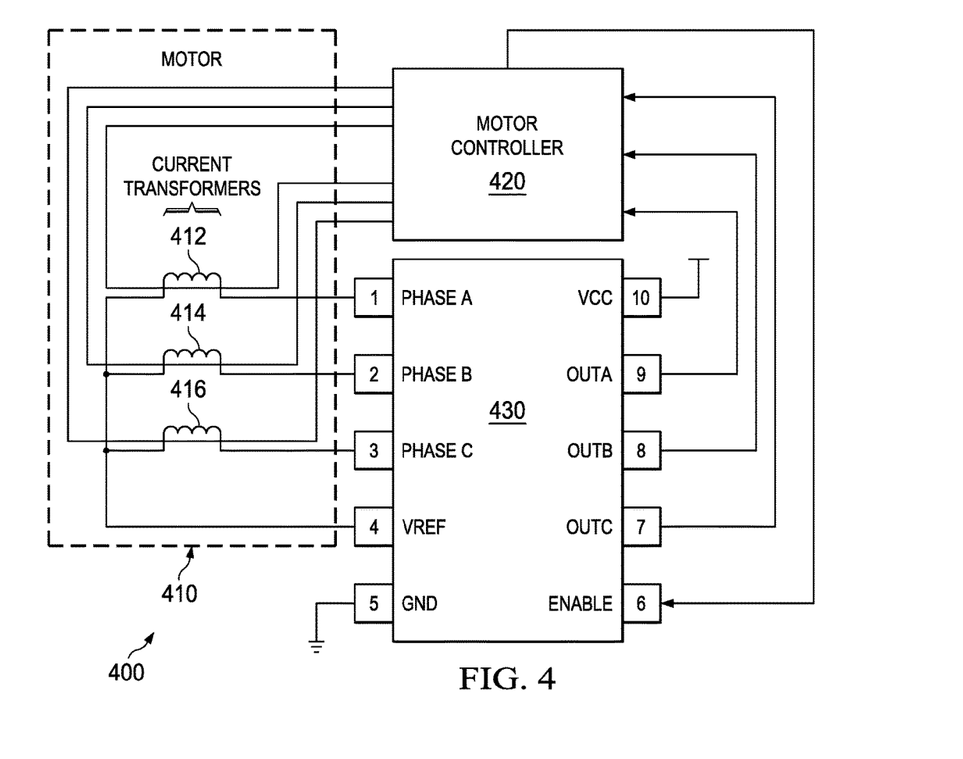
FIG. 4 is a schematic diagram of a reduced input-impedance active current-measurement system in accordance with embodiments on the present disclosure.

FIG. 4 is a schematic diagram of a reduced input-impedance active current-measurement system in accordance with embodiments on the present disclosure. In some embodiments, the system 400 includes a motor 410, a motor controller 420, and an active current sensing circuit 430. The motor controller 420 and the active current sensing circuit 430 can be formed on the same or different substrates. In some embodiments, a portion of the active current sensing circuit(s) is formed on a substrate that is different from a substrate of the controller, which helps avoid damage or improper operation to the active current sensing circuit(s) resulting from (accidentally) shorted or noise from high-voltage, high-current power used by the motor controller 420 to generate drive signals for the motor 410.

Generally, the system 400 includes control circuitry for measuring current flowing through the motor 410 (e.g., via the active current sensing circuit 430) and controlling power for driving each phase of a three-phase motor 410 (e.g., such that the motor controller 420 generates power for each phase of the current being monitored). Accordingly, the system 400 includes a closed-loop control system (e.g., where the control loop is closed by the measurements the active current sensing circuit 430 performs and sends to the motor controller 420).

For example, motor 410 is a high-power, three-phase (alternating-current) motor and includes three current-transformers 412, 414, and 416 for monitoring each of the three phases of the motor 410. The three current-transformers 412, 414, and 416 can be toroidal coils, which can be mounted securely to a component of the motor 410 (such as a casing or support member). The motor controller 420 (e.g., in response to the measurements from provided by the active current sensing circuit 430) generates three-phase power signals for driving a respective coil of the motor. The current flowing through each of the three-phase power signals are respectively transformed into secondary currents (e.g. via current-transformer 412, 414, and 416). The transformed secondary currents respectively indicate control power for driving a respective phase of a three-phase motor. Each of the transformed secondary currents are coupled to respective terminals (e.g., pins) of the active current sensing circuit 430. The current transformers 412, 414, and 416 are selected to have a turns ratio to step-down the voltage (e.g., from primary to secondary) such that the secondary voltage is compatible with cost-effective semiconductor technology).

The secondary currents (e.g., which are inductively coupled from the primary) consume an insubstantial portion of the power provided for driving the motor 410.

As discussed below with reference to FIG. 5, the active current-sensing circuit 430 includes active current-measuring circuits (such as circuit 200 described above) for generating an equal and offsetting current for each of the transformed secondary currents (phase A, phase B, and phase C). Each of the offsetting currents supplied to each of the transformed secondary currents reduces and/or eliminates the burden resistance associated with circuitry of the active current sensing circuit 430 for measuring each of the transformer secondary currents. The active current-sensing circuit 430 generates a current measurement indication signal (OUTA, OUTB, and OUTC) in response to a measurement respectively being performed for each of the transformer secondary currents. The current measurement indication signals are coupled to the motor controller 420.

The motor controller 420 is arranged to receive each of the phase indication signals and to generate a respective phase power signal in response. The motor controller 420 can evaluate the waveforms of each of the phase indication signals to determine whether, for example, the motor 410 is operating properly. In one example, high currents for all three-phase power signals (as indicated by each of the phase indication signals) can indicate a motor malfunction (e.g., where the motor shaft does not turn at a desired rotational frequency or cannot turn): upon detecting a malfunction, the motor controller 420 can disable the motor 410 (e.g., by not asserting phase power signals) and disable the active current-sensing circuit 430 (e.g., by deasserting the enable signal).

Figure 5:
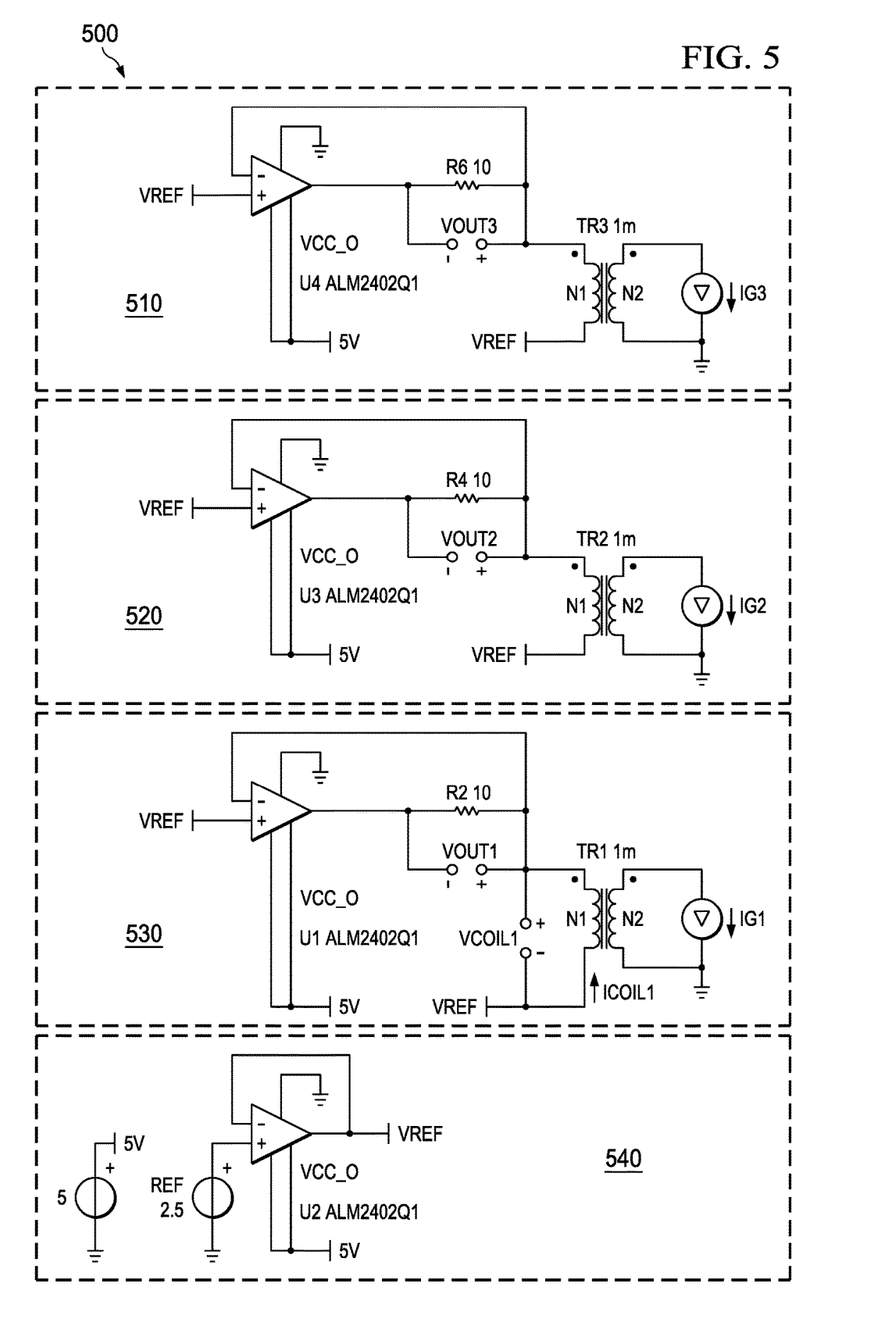
FIG. 5 is a schematic diagram of a three-phase input-impedance active current-measurement circuit model in accordance with embodiments on the present disclosure.

FIG. 5 is a schematic diagram of a three-phase input-impedance active current-measurement circuit model in accordance with embodiments on the present disclosure. In some embodiments, the current measurement circuit model 500 includes a first-phase current measurement circuit 530, a second-phase current measurement circuit 520, a third-phase current measurement-circuit 510, and a voltage reference generator 540. The voltage reference generator 540 and the current measurement circuits 530, 520, and 510 can be formed on the same or different substrates for use in an actual system. Generally, the current measurement circuit model 500 includes voltage reference generator 540 for generating a reference voltage by which each of the current measurement circuits 530, 520, and 510 generate a respective current measurement indication signal (VOUT1, VOUT2, and VOUT3). In an embodiment, the circuitry is operable in response to a 5-volt positive power rail.

For example, the first-phase current measurement circuit 530 is a measurement circuit such as circuit 200. The first-phase current measurement circuit 530 includes a first transformer TR1, a first sense resistor R2, and a first operational amplifier U1. The first transformer includes a primary N2 and a secondary N1 and is arranged to inductively generate (in the secondary) a first sense current for indicating a current IG1 flowing in the primary of the first transformer TR1. (The alternating current waveform of the current IG1 is discussed below with respect to FIG. 6.)

The first sense current (for indicating a current IG1 flowing through the primary of the first transformer TR1) is coupled to the first terminal of the first sense resistor R2 and coupled to an inverting input of the first operational amplifier U1. The first operational amplifier U1 includes a non-inverting input, which is coupled to a voltage reference (e.g., 2.5 VDC).

In a steady state (e.g., in the absence of current IG1), the voltage VREF is applied to the inverting input of U1, and the output of the operational amplifier U1 (e.g., assuming no voltage offset of the operational amplifier U1 inputs) stabilizes the feedback loop to the voltage of VREF (e.g., at the second terminal of the sense resistor) in response to VREF and the feedback voltage. Accordingly, the voltage developed at the output (e.g., at the second terminal of the first sense resistor) of the operational amplifier (U1) is a neutral voltage (e.g., zero volts), which is neutral with respect to the positive and negative voltages developed across (the first and second terminals of) the first sense resistor (e.g., VOUT1).

When the (e.g., AC) current of IG1 is applied to the primary of TR1, the first sense current changes the voltage developed at the inverting input of the first operational amplifier U1. In response to the change in voltage at the inverting input of the operational amplifier U1 (e.g., and with reference to the reference voltage coupled to the noninverting input of the first operational amplifier U1), the first operational amplifier U1 generates a first offsetting current output in response to the first sense current.

The first offsetting current is coupled to a second terminal of the first sense resistor R2. The first offsetting current offsets at least a portion of the first sense current, which reduces the input impedance of the first-phase measurement circuit 530. The first-phase current measurement circuit 530 generates a first current measurement indication signal (e.g., VOUT1) in response to a voltage developed across the first sense resistor R2.

Accordingly, the first-phase measurement circuit 530 is arranged to receive a first sense current for indicating current flowing through a primary of a first transformer of a motor. The first phase measurement circuit 530 is arranged to generate a first offsetting current opposite to the received sense current. The generated offsetting current lowers the burden resistance of the first-phase measurement circuit 530, which reduces the effect of the phase-current measurement circuit 530 upon the sense current being measured. The first current measurement indication signal is, accordingly, generated in response to the generated first offsetting current.

The second-phase measurement circuit 520 is a measurement circuit similar to the first phase measurement circuit 530. The second-phase measurement circuit 520 includes a second transformer TR2, a second sense resistor R4, and a second operational amplifier U3. The second transformer TR2 includes a primary N2 and a secondary N1 and is arranged to generate a second sense current for indicating a current IG2 flowing the primary of the second transformer TR2. The signals IG2 and VOUT2 are generated in a similar manner (albeit phase shifted) as the respective signals IG1 and VOUT1 are generated. Signals IG2 and VOUT2 are discussed below with respect to FIG. 6.

The third-phase measurement circuit 510 is a measurement circuit similar to the first-phase measurement circuit 530. The third-phase measurement circuit 510 includes a third transformer TR3, a second sense resistor R6, and a third operational amplifier U4. The third transformer TR3 includes a primary N2 and a secondary N1 and is arranged to generate a third sense current for indicating a current IG3 flowing the primary of the third transformer TR2. The signals IG3 and VOUT3 are generated in a similar manner (albeit phase shifted) as the respective signals IG1 and VOUT1 are generated. Signals IG2 and VOUT2 are discussed below with respect to FIG. 6.

The voltage reference generator 540 includes components of similar physical attributes to like components in the measurement circuits 530, 520, and 510 (e.g., such that operational characteristics of like components of the different measurement circuits 530, 520, and 510 closely match over temperature and component aging). The voltage reference generator 540 includes an operational amplifier U2 arranged as an inverting op-amp circuit for generating the voltage reference in response to an input reference voltage. The generated voltage reference is coupled respectively to the first, second, and third operational amplifiers (U1, U3, U4) for amplifying each respective sense current. An optional decoupling capacitor C1 is arranged to low-pass filter the generated voltage reference. The generated voltage (e.g., 2.5 VDC) is coupled to the secondary of the respective first, second, and third transformers (TR1, TR2, TR3). The coil current (e.g., ICOIL1) of each respective transformer (e.g., TR1) is AC-modulated in response to a current (e.g., IG1) applied to the primary of the respective transformer.

Figure 6:
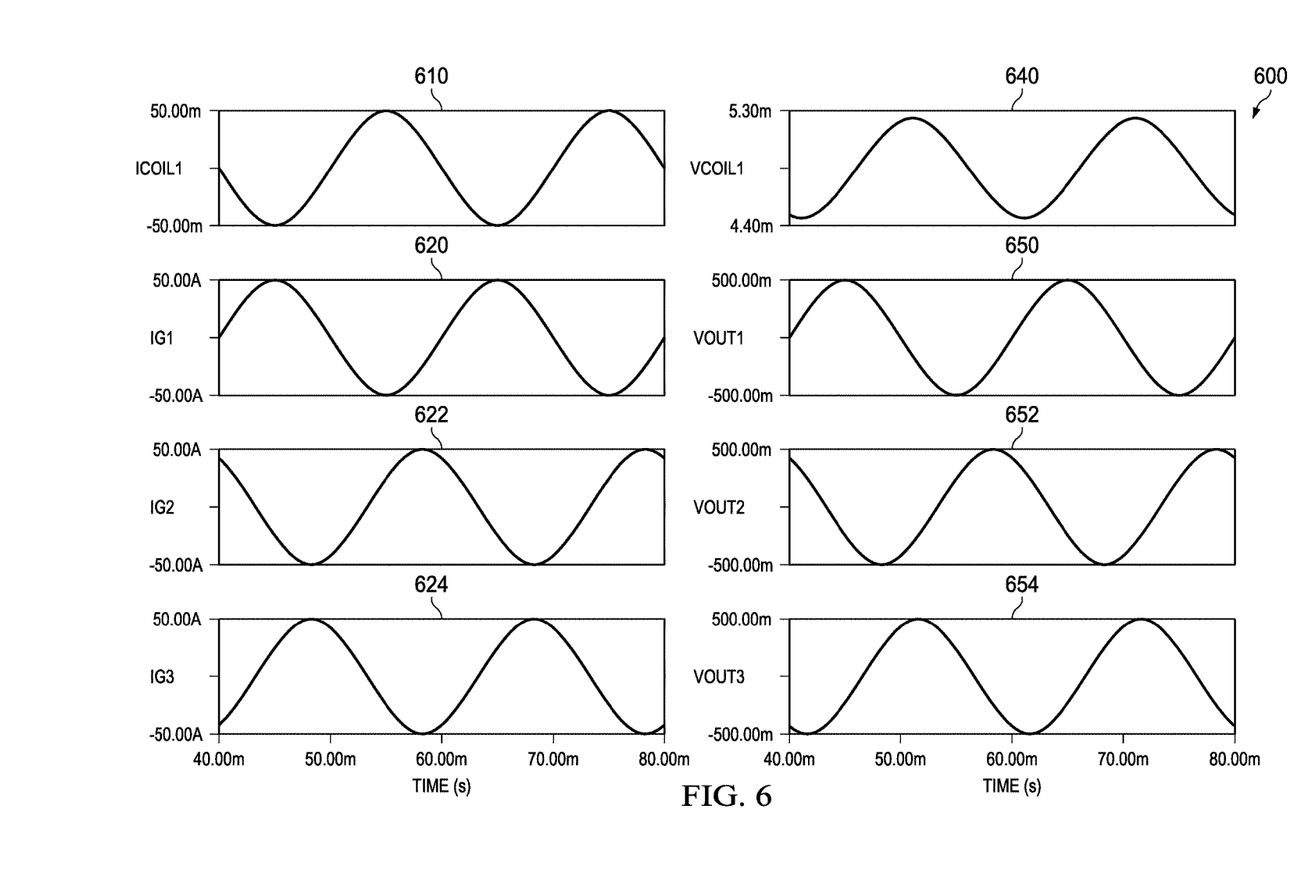
FIG. 6 is a waveform diagram of waveforms generated by the three-phase input-impedance active current-measurement circuit model in accordance with embodiments on the present disclosure.

FIG. 6 is a waveform diagram of waveforms generated by the three-phase input-impedance active current-measurement circuit model 500 in accordance with embodiments on the present disclosure. The diagram 600 includes the waveforms ICOIL1 610, IG1 620, IG2 622, IG3 624, VCOIL 640, VOUT1 650, VOUT2 652, and VOUT3 654.

The waveforms in diagram 600 are generated in response to system parameters such as a transformer (TR1, TR2, and TR3) having a turns-ratio of 1000 ("1 m"), a virtual ground (VREF) of 2.5 volts (which is half of the operating supply voltage of +5 volts), sense resistors of 10 ohms (e.g., where 50 mA peak current flows through the 10-ohm sense resistors, which generates plus and minus 500 mV peak voltages in accordance with Ohm's Law). The peak voltage generated across the sense resistor is greater than (for example) the voltage offset of the operational amplifiers (e.g., U2, U3, and U4) such that a substantially accurate sensing signal (e.g., VOUT1, VOUT2, and/or VOUT3) is generated while presenting a substantially low effective input impedance (e.g., such that the signal to be measured—ICOIL1—is not affected by the measurement).

For the first-phase current measurement circuit 530, the waveform ICOIL1 (610) indicates the waveform generated in response to the waveform IG1 (620) applied to the primary of the transformer TR1. For example, the waveform IG1 (620) is a sinusoidal (e.g., AC) waveform, which extends from around a "–" (minus) 50 amp peak to a "+" (positive) 50 amp peak and is applied to the primary coil N2 of the transformer TR1. Accordingly, the waveform ICOIL1 (610) sinusoidal (e.g., AC) waveform is generated in the secondary of the transformer TR1 and extends from around a "–" (minus) 50 milliamp peak to a "+" (positive) 50 milliamp peak. The waveform VCOIL1 (640) is the voltage generated across the secondary coil N1 of the transformer TR1 in response to the modulation of VREF by IG1 (620). The waveform VCOIL1 (640) extends from around a "+" (positive) 4.4 millivolt peak to a +5.3 millivolt peak. The waveform VOUT1 (650) sinusoidal (e.g., AC) waveform is generated across the first sense resistor R2 (at 10 Ohms) and extends from around a "–" (minus) 500 millivolt peak to a "+" (positive) 500 millivolt peak. (Although sinusoidal waveforms are illustrated, the actual waveform can be an arbitrary waveform selected by a system designer.)

For the second-phase current measurement circuit 520, the waveform IG2 (620) is applied to the primary of the transformer TR2. For example, the waveform IG2 (622) is similar to IG1 (620), albeit phase shifted (e.g., in accordance with 120-degree phase shifts of three-phase power). Accordingly, the waveform VOUT2 (652) is generated in response to the waveform IG3 (622). The waveform VOUT2 (652) is similar to VOUT1 (650), albeit phase shifted in accordance with the waveform IG3 (622).

For the third-phase current measurement circuit 510, the waveform IG3 (620) is applied to the primary of the transformer TR3. For example, the waveform IG3 (624) is similar to IG1 (620), albeit phase shifted (e.g., in accordance with 120 degree phase shifts of three-phase power). Accordingly, the waveform VOUT3 (654) is generated in response to the waveform IG3 (624). The waveform VOUT3 (654) is similar to VOUT1 (650), albeit phase shifted in accordance with the waveform IG3 (624).

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A circuit, comprising:
a first amplifier including an inverting input coupled to a first input terminal for receiving a first sense current, a non-inverting input coupled to an output terminal for returning at least a first portion of current in response to the received first sense current, and an output; and
a first sense resistor including a first terminal coupled to the input terminal and a second terminal coupled to the output of the first amplifier; and
the first amplifier being arranged for generating a current equal to the magnitude of the received first sense current and for coupling the current equal to the magnitude of the received first sense current to the second terminal of the sense resistor.

2. The circuit of claim 1, in which the first sense resistor develops a sensed voltage in response to the received sense current, and the sensed voltage indicates the magnitude of the received sense current.

3. The circuit of claim 1, in which the generated current equal to the magnitude of the received sense current is opposite in polarity to the received sense current.

4. The circuit of claim 1, in which the returned first portion of current is equal to the received first sense current.

5. The circuit of claim 1, in which the first sense current includes a sinusoidal waveform.

6. The circuit of claim 5, including:
a second amplifier including an inverting input coupled to a second input terminal for receiving a second sense current, a non-inverting input coupled to the output terminal for returning at least a second portion of current in response to the received second sense current, and an output, the second sense current is phase shifted with respect to the first sense current; and
a second sense resistor including a first terminal coupled to the second input terminal and a second terminal coupled to the output of the second amplifier.

7. The circuit of claim 6, including:
a third amplifier including an inverting input coupled to a third input terminal for receiving a third sense current, a non-inverting input coupled to the output terminal for returning at least a third portion of current in response to the received third sense current, and an output, the third sense current is phase shifted with respect to the first sense current, and the first, second, and third sense currents are for indicating control power for driving each phase of a three-phase motor; and a third sense resistor including a first terminal coupled to the third input terminal and a second terminal coupled to an output of the third amplifier.

8. A system comprising:
a first toroidal coil for monitoring a first drive signal and generating a first sense current in response to the first drive signal;
a first sensing circuit generating a first sensed voltage signal in response to a first sense current in which the first sensing circuit includes a first sense resistor coupled to the first sense current, and the first sense resistor includes a resistance greater than a resistance limiting the first sense current; and
a controller for generating the first drive signal in response to the first sensed voltage signal.

9. The system of claim 8, in which the first sensing circuit includes a first amplifier for lowering the resistance between a first input node and an output node to a resistance that is less than a resistance of the first sense resistor, the first input node and an output node are coupled to opposing nodes of a secondary of the first toroidal coil.

10. The system of claim 9, including:
a second toroidal coil for monitoring a second drive signal of the motor and for generating a second sense current generated in response to the monitored second drive signal; and
a second sensing circuit including a second amplifier for lowering the resistance between a second input node and the output node to a resistance that is less than a resistance of the second sense resistor and for generating the second sensed voltage signal in response to the second sense current, the second input node and an output node are coupled to opposing nodes of a secondary of the second toroidal coil, and the second drive signal is generated in response to the second sensed voltage signal.

11. The system of claim 10, including:
a third toroidal coil for monitoring a third drive signal of the motor and for generating a third sense current generated in response to the monitored third drive signal; and
a third sensing circuit including a third amplifier for lowering the resistance between a third input node and the output node to a resistance that is less than a resistance of the third sense resistor and for generating the third sensed voltage signal in response to the third sense current, the third input node and an output node are coupled to opposing nodes of a secondary of the third toroidal coil, and the third drive signal is generated in response to the third sensed voltage signal.

12. The system of claim 9, in which the first sensing circuit is formed on a substrate that is different from a substrate of the controller.

13. The system of claim 9, in which the first toroidal coil is mounted to a component of the motor.

14. A method, comprising:
receiving a first sense current,
generating an first offsetting current in response to the first sense current, the first offsetting current is opposite in polarity to the first sense current;
developing a first sensed voltage signal across a first sense resistor in response to the received first sense current and the first offsetting current, the first sense resistor including a resistance greater than a resistance limiting the received first sense current; and
generating a first drive signal in response to the first sensed voltage signal.

15. The method of claim 14, including:
receiving a second sense current,
generating an second offsetting current in response to the second sense current, the second offsetting current is opposite in polarity to the first sense current, and the second offsetting current and the first offsetting current are generated in response to a common voltage reference; and
developing a second sensed voltage signal across a second sense resistor in response to the second first sense current and the second offsetting current.

* * * * *